(12) United States Patent
Kocer et al.

(10) Patent No.: US 8,319,559 B2
(45) Date of Patent: Nov. 27, 2012

(54) ACTIVE BIAS CONTROL CIRCUIT FOR AN AMPLIFIER AND METHOD OF POWER UP SEQUENCING THE SAME

(75) Inventors: Fatih Kocer, Istanbul (TR); Frank A. Traut, Brookline, NH (US); Yalcin Alper Eken, Istanbul (TR); Katzin Peter, Arlington, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 12/924,674

(22) Filed: Oct. 1, 2010

(65) Prior Publication Data

US 2011/0084767 A1 Apr. 14, 2011

Related U.S. Application Data

(60) Provisional application No. 61/278,250, filed on Oct. 5, 2009.

(51) Int. Cl.
*H03F 3/04* (2006.01)
(52) U.S. Cl. ........................ 330/296; 330/297
(58) Field of Classification Search .................. 330/285, 330/296, 297; 327/538
See application file for complete search history.

(56) References Cited

U.S. PATENT DOCUMENTS

| | | | |
|---|---|---|---|
| 5,311,143 A | 5/1994 | Soliday | |
| 5,361,007 A | 11/1994 | Ohta | |
| 5,506,544 A | 4/1996 | Staudinger et al. | |
| 5,554,954 A | 9/1996 | Takahashi | |
| 6,614,309 B1* | 9/2003 | Pehlke | 330/296 |
| 6,630,867 B2* | 10/2003 | Canyon et al. | 330/297 |
| 6,657,499 B2 | 12/2003 | Lin | |
| 7,420,421 B1* | 9/2008 | Lie et al. | 330/296 |
| 2003/0178976 A1* | 9/2003 | Xi | 323/273 |
| 2004/0046609 A1 | 3/2004 | Xu | |
| 2005/0218991 A1 | 10/2005 | Birbeck | |
| 2006/0043945 A1 | 3/2006 | Sohn et al. | |
| 2006/0119385 A1 | 6/2006 | Balasubramanian et al. | |
| 2007/0029975 A1* | 2/2007 | Martin et al. | 320/134 |
| 2008/0094101 A1 | 4/2008 | Balasubramanian et al. | |
| 2009/0033298 A1 | 2/2009 | Kleveland | |

OTHER PUBLICATIONS

Written Opinion of the International Searching Authority; PCT Application No. PCT/US2010/002678, mailed Dec. 9, 2010, (5 pgs. (unnumbered)).
Written Opinion of the International Searching Authority; PCT Application No. PCT/US2010/002679, mailed Dec. 9, 2010, (7 pgs. (unnumbered)).

(Continued)

*Primary Examiner* — Khanh V Nguyen
(74) *Attorney, Agent, or Firm* — Iandiorio Teska & Coleman, LLP

(57) ABSTRACT

An active bias control circuit for an amplifier includes a low dropout regulator for providing a regulated voltage to provide an input current to the amplifier, and a current sense circuit responsive to the low dropout regulator for sensing a scaled down replica of the input current to the amplifier. An amplifier control circuit adjusts a control voltage to the amplifier in response to the sensed, scaled down replica of the input current to regulate the input current to the amplifier. A method for power up sequencing an amplifier for an active bias control circuit for the amplifier is also disclosed.

33 Claims, 17 Drawing Sheets

OTHER PUBLICATIONS

Zhiming et al., "A 1.8 V LDO voltage regulator with foldback current limit and thermal protection", 2009 Chinese Institute of Electronics, Journal of Semiconductors, vol. 30, No. 8, 5 pgs.

STMicroelectronics, Datasheet STLA01, "50 mA stand-alone linear LED driver", www.st.com, Nov. 2007, Rev. 1, 16 pgs.

Web page, http://electronicdesign.com/article/power/gaasfet-power-supply-has-negative-gate-bias-automa.aspx, "GaAsFET Power Supply Has Negative Gate Bias, Automatic Power-Up Sequencing", Oct. 4, 1999, 2 pgs.

Zetex, Datasheet ZNBG2000 ZNBG2001, "FET Bias Controller", www.zetex.com, Issue 1, Aug. 2001, 7 pgs.

Sumitomo Electric, Technical Note, "P0110003P 800mW GaAs Power FET", www.sei.co.jp/GaAsIC/, Sep. 2003, 13 pgs.

Agilent Technologies, Application Note, "2.0 GHz high-linearity second stage LNA/driver using Agilent ATF-53189", www.agilent.com/semiconductors, Sep. 9, 2005, 14 pgs.

Infineon Technologies, Datasheet, "BCR400W Active Bias Controller", www.infineon.com, Aug. 7, 2001, 7 pgs.

\* cited by examiner

ACTIVE BIAS CONTROL CIRCUIT FOR AN AMPLIFIER AND METHOD OF POWER UP SEQUENCING THE SAME

RELATED APPLICATIONS

This application hereby claims the benefit of and priority to U.S. Provisional Patent Appl. No. 61/278,250, filed on Oct. 5, 2009 under 35 U.S.C. §§119, 120, 363, 365, and 37 C.F.R. §1.55 and §1.78, which application is incorporated herein by reference. This application is also related to the application filed on even date herewith entitled "Switched Active Bias Control and Power-On Sequencing Circuit for an Amplifier", which is also incorporated herein by reference.

FIELD OF THE INVENTION

The subject invention relates to an active bias control circuit for an amplifier.

BACKGROUND OF THE INVENTION

Amplifiers are one of the main building blocks of any system that receives or transmits signals. They may be used to amplify a received signal to increase the signal strength and improve the signal to noise ratio (SNR), and may be used in transmitter chains to amplify signals to acceptable levels to drive antennae. They may also be used between system blocks to amplify a signal as desired.

A typical amplifier includes one or more transistors. These transistors could be any kind (bipolar, MOSFET, MESFET, JFET, etc.) and can be of any mode (depletion or enhancement type), depending on the specific needs of the application. Regardless of the type and mode of the amplifier, the transistor used in the amplifier should be biased at its gate or its base in order to achieve active operation. The bias point affects many parameters of the amplifier such as, efficiency, noise figure, linearity, stability and gain. However, every transistor is different from each other. Their threshold (pinch-off) value varies from part to part due to process variation, as well as aging and temperature. In order to compensate for these changes, quiescent bias through amplifiers should be monitored and their gate or base voltage preferably adjusted constantly to achieve stable operation.

An active bias control is a feedback system that typically measures the quiescent bias through a transistor and adjusts the gate or base of the amplifier to achieve a stable bias point. Many system level and on-chip active bias control loops have been designed and published over the years.

U.S. Pat. No. 5,361,007 to Ohta discloses an apparatus for generating a stable amplifier gate voltage by sensing the current passing through the amplifier by using a sense resistor in series with the amplifier (connected to the drain or collector) and using feedback to keep the voltage across this sense resistor constant. U.S. Pat. No. 5,311,143 to Soliday discloses another sensing apparatus which connects the sense resistor to the emitter of the amplifier rather than the collector. U.S. Pat. No. 6,657,499 to Lin discloses a bias generation circuit that uses a sense resistor connected in series with the amplifier.

These prior systems described above use a sense resistor in series with the RF amplifier which is desirable to avoid since the total quiescent current of the amplifier is also passing through the sense resistor. This requires very accurate trimming of the sense resistor. If the quiescent current of the amplifier is large (>1 A, which is the case for driver amplifiers) the sense resistor should be large enough to handle the current as well as accurate enough not to cause part to part variation.

Another important consideration for amplifiers is the proper power-up/power-down sequence to be applied to the amplifier. If a drain voltage is applied before the bias generator is properly turned on, excessive current will pass through the amplifier, possibly damaging it.

BRIEF SUMMARY OF THE INVENTION

It is therefore an object of this invention to provide an active bias control circuit for an amplifier that does not rely on the use of a sense resistor in series with the amplifier.

It is a further object of this invention to provide an improved method of power up sequencing an active bias control circuit for an amplifier.

The subject invention, however, in other embodiments, need not achieve all these objectives and the claims hereof should not be limited to structures or methods capable of achieving these objectives.

The invention results in part from the realization that for an active bias control circuit, rather than using a low value sense resistor in series with the supply input of an external amplifier to sense the input current provided to the external amplifier for adjusting the amplifier's control voltage, it is more advantageous to determine the input current by sensing the current from a scaled down replica of the input current to the amplifier.

SUMMARY OF THE INVENTION

This invention features an active bias control circuit for an amplifier, including a low dropout regulator for providing a regulated voltage and an input current to the amplifier, a current sense circuit responsive to the low dropout regulator for sensing a scaled down replica of the input current to the amplifier, and an amplifier control circuit for adjusting a control voltage to the amplifier in response to the sensed, scaled down replica of the input current to regulate the input current to the amplifier.

In one embodiment, the low dropout regulator may include a first transistor for providing the input current to the amplifier, and an error amplifier responsive to a reference voltage and the first transistor, and the sense circuit may include a second transistor coupled to the first transistor having a transconductance less than the first transistor for providing the scaled down replica of the output current of the first transistor. The current sense circuit may include a sense resistor responsive to the second transistor for providing a voltage corresponding to the scaled down replica of the input current to the amplifier. The amplifier control circuit may be responsive to the voltage across the sense resistor for controlling the control voltage of the amplifier. The active bias control circuit may include a switch coupled in series between the low dropout regulator and the input of the amplifier for switching off the input current to the amplifier. The switch may include a switching transistor. The active bias control circuit may include a level shifter for biasing the switching transistor.

The low dropout regulator may include a bandgap reference circuit for generating the reference voltage. The amplifier control circuit may be configured to provide either a positive or negative control voltage. The amplifier control circuit may be configured to provide either a positive or negative control voltage. The first and second transistors may be on the same integrated circuit for matching one or more predetermined characteristics. The active bias control circuit may include a second control circuit configured to enable the active bias control circuit. The low dropout regulator may include a foldback circuit for timing the control voltage to the first transistor when the power dissipation of the first transistor exceeds a predetermined threshold. The active bias control circuit may be on an integrated circuit chip, and the second control circuit may be configured to: provide a control voltage for an amplifier including either an enhancement mode or depletion mode device, operate using a negative voltage supply generated either by the integrated circuit chip or externally, and/or provide either a fixed control voltage or adjust the control voltage in response to the determined input current to keep the input current to the amplifier constant. The amplifier control circuit may be configured by user accessible pins connected to the integrated circuit chip. The user accessible pins may be used to adjust the negative voltage supply generated by the integrated circuit chip. The amplifier control circuit may be configured to: control a control voltage of the amplifier to bring the amplifier control voltage below pinch off, if the control voltage is below pinch off, generate a first enable signal to enable drain current to flow to the amplifier, generate a second enable signal when the drain voltage is stabilized, and in response to the second enable signal, increase the control voltage to achieve a predetermined amplifier input current. The amplifier control circuit may be configured to generate a trigger out signal after the predetermined amplifier input current is achieved. The first enable signal may turn on a switch to enable the drain current to flow to the amplifier. The second enable signal may turn on an amplifier control circuit to stabilize the drain current. The amplifier input current is reduced to a level to prevent damage to circuitry if a drain terminal of the amplifier is shorted to ground. The circuit may further include: a feedback amplifier having its inputs coupled to the drains of the first and second transistors, and a transistor coupled between the second transistor and the sense resistor and having a control terminal responsive to an output of the feedback amplifier for improving the current scaling accuracy of the first and second transistors.

This invention also features an active bias control circuit, including a low dropout regulator for providing a regulated voltage and including a first transistor for providing an input current to the amplifier, and an error amplifier responsive to a reference voltage and the first transistor, a sense circuit including a second transistor having a control terminal coupled to a control terminal of the first transistor for providing and sensing the scaled down replica of the output current of the first transistor, the first and second transistors located on the same integrated circuit for matching one or more predetermined characteristics, and an amplifier control circuit for providing a control voltage to the amplifier and adjusting the control voltage of the amplifier in response to the sensed scaled down replica of the input current to keep the input current to the amplifier constant.

This invention also features an active bias control circuit on an integrated circuit chip, including a low dropout regulator for providing a regulated voltage and an input current to an amplifier, a current sense circuit responsive to the low dropout regulator for determining the input current to the amplifier, and an amplifier control circuit for providing a control voltage to the amplifier, the amplifier control circuit configurable to: provide a control voltage for an amplifier including either an enhancement mode or depletion mode device, operate using a negative voltage supply generated either by the integrated circuit chip or externally, and/or either provide a fixed control voltage or adjust the control voltage in response to the determined input current to keep the input current to the amplifier constant.

In one embodiment, the amplifier control circuit may be configurable by grounding or floating predetermined pins connected to the integrated circuit chip. The user accessible pins may be further used to adjust the negative voltage supply generated by the integrated circuit chip.

This invention also features a low dropout regulator for providing a regulated voltage and an input current to an amplifier, the regulator including a first transistor for providing an input current to the amplifier, and an error amplifier responsive to a reference voltage and the first transistor for adjusting the regulated voltage to the amplifier, a switch including a switching transistor coupled in series between the first transistor and the input of the amplifier for switching off the input current to the amplifier, and a level shifter coupled to the control terminal of the switching transistor for biasing the switching transistor.

This invention further features a method for power up sequencing of an active bias controller for an external amplifier, the method comprising the steps of controlling a control voltage of the amplifier to bring the amplifier control voltage below pinch off, if the amplifier control voltage is below pinch off, generating a first enable signal to enable drain current to flow to the amplifier, generating a second enable signal when the drain voltage is stabilized, and in response to the second enable signal, enabling the control voltage to achieve a predetermined amplifier input current.

In on embodiment, the method may include the step of generating a trigger out signal after the predetermined amplifier input current is achieved. The first enable signal turns on a switch may enable the drain current to flow to the amplifier. The second enable signal may turn on an amplifier control circuit to stabilize the drain current. The control voltage may be further adjusted in response to a sensed, scaled down replica of the input current to regulate the input current to the amplifier. The pinch off voltage may be a predetermined voltage. The method may further include the step of programming a user accessible pin to set the predetermined voltage.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
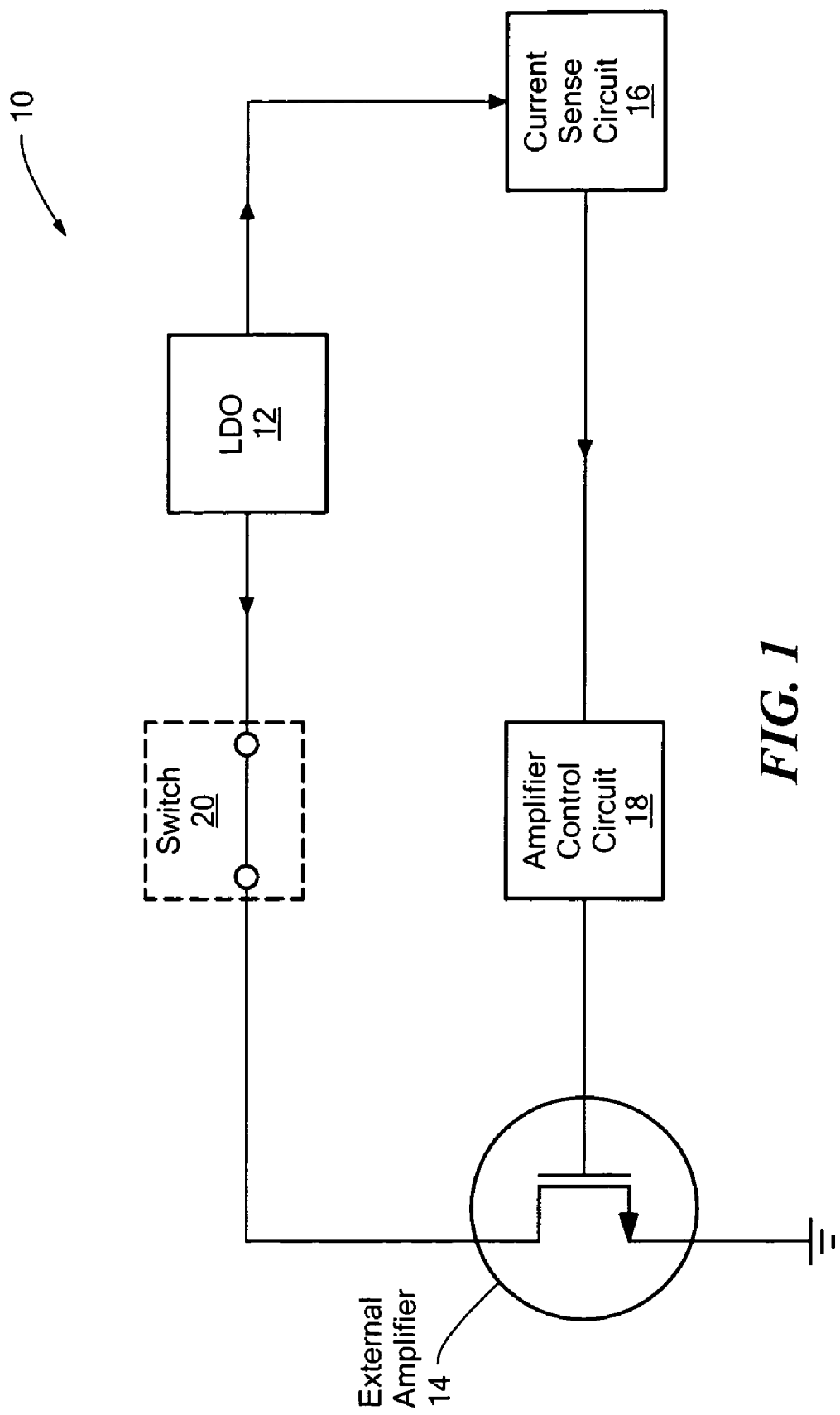
FIG. 1 is a block diagram showing an active bias control circuit in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

An active bias control circuit 10 in accordance with the invention is shown in FIG. 1. An active bias control circuit 10 includes a low drop-out (LDO) regulator 12 that provides a regulated output voltage and an input current for an amplifier 14 which may be external to LDO 12. To avoid the use of a sense resistor in series with amplifier 14, a current sense circuit 16 responsive to LDO 12 is used to sense the input current to amplifier 14 and provide a scaled-down replica of this input current to the amplifier. An amplifier control circuit 18 is responsive to current sense circuit 16 and provides a control voltage to amplifier 14 to adjust the control voltage based upon the sensed scaled-down replica of the input current. By adjusting the control voltage of amplifier 14, the input current to amplifier 14 is thereby regulated. Although amplifier 14 is shown in FIG. 1 as a FET amplifier having the control voltage at its gate adjusted, amplifier 14 could be any type of transistor such as a bipolar, IGBT, etc., and could be a depletion or enhancement type FET transistor. Active bias control circuit 10 may also include a switch 20 for disconnecting LDO 12 from amplifier 14 when the active bias control circuit is disabled.

Figure 2:
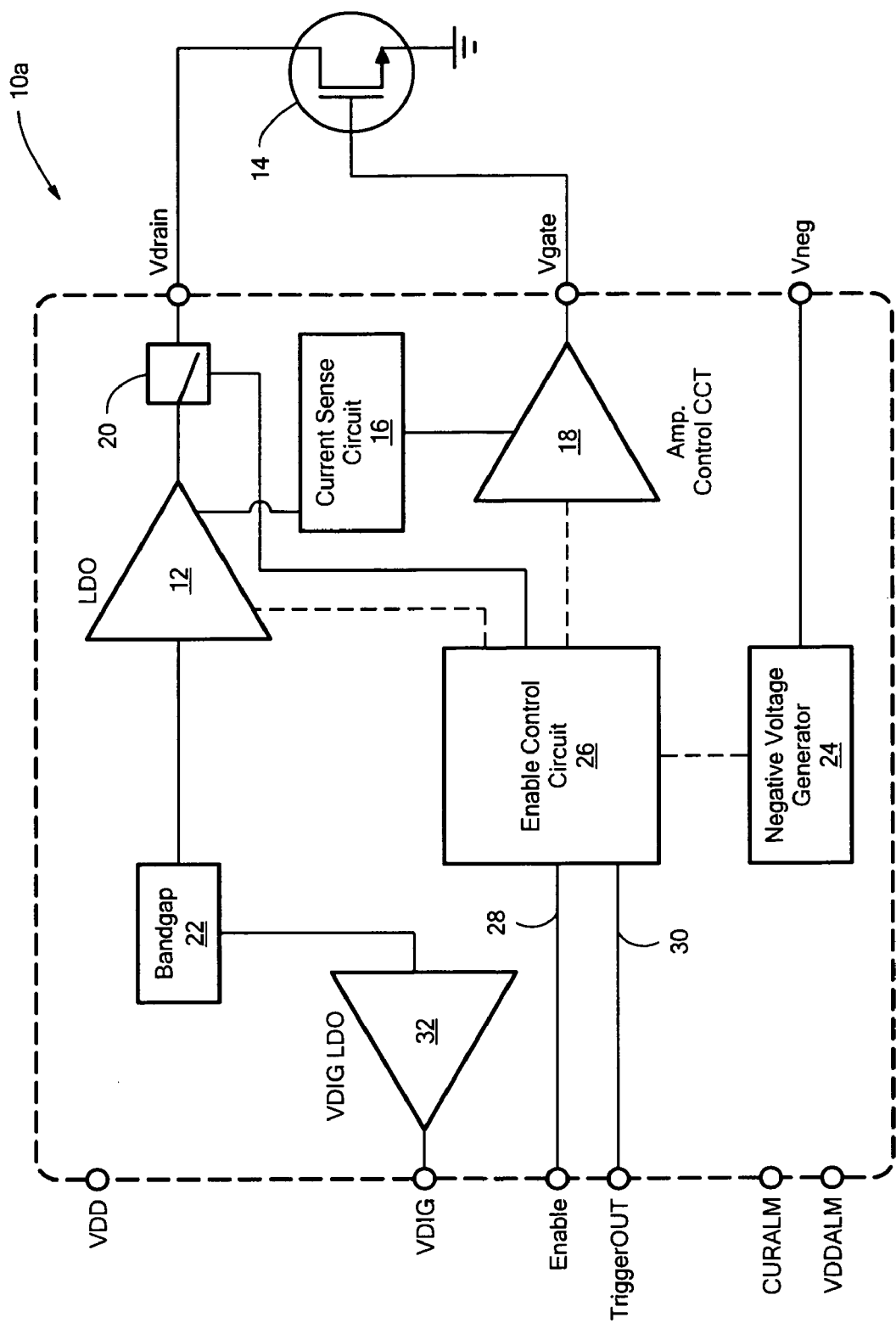
FIG. 2 is a block diagram of one embodiment of the active bias control circuit of FIG. 1.

A more detailed block diagram of the active bias control circuit 10a, FIG. 2, includes a bandgap reference circuit 22 which generates a reference voltage for LDO 12 and may generate other reference voltages and currents which are very stable over the external supply input voltage, temperature, and process variations. Active bias control circuit 10a also includes a negative voltage generator 24 which generates a stable negative voltage that can bias an amplifier using a depletion mode device. The output of negative voltage generator 24 is preferably externally adjustable and may be disabled if an external negative supply is already available or not required. Circuit 10a also includes an enable control circuit 26 to enable the active bias control system 10a in response to an ENABLE signal on line 28. Circuit 26 may be used to safely turn on external amplifier 14, as further described below, and to generate a trigger out signal on line 30 once an acceptable quiescent point is achieved for amplifier 14. A second low drop-out regulator 32 may also be provided to generate a constant digital supply to bias circuit 26. The components of active bias control circuit 10a may be manufactured on an integrated circuit (IC) 34 having the connections as shown in FIG. 2 with amplifier 14 external to IC 34 as shown.

Figure 3:
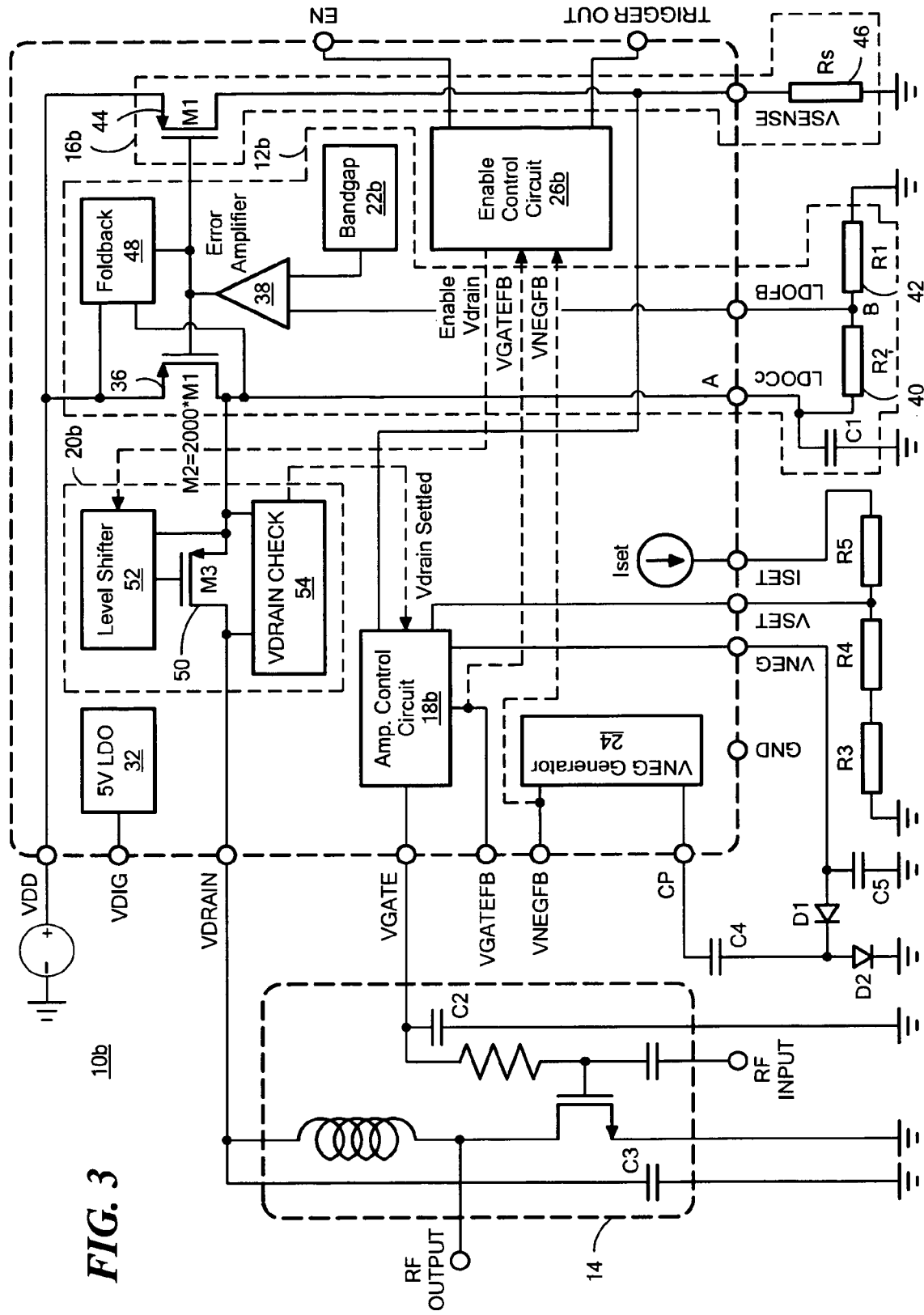
FIG. 3 is a schematic diagram of a more detailed embodiment of the active bias control circuit of FIG. 2.

In one embodiment, LDO 12b, FIG. 3, includes a first transistor 36 for providing the drain input current to amplifier 14, and an error amplifier 38 which is responsive to a reference voltage from bandgap reference circuit 22b and first transistor 36. Error amplifier 38 receives a voltage from bandgap reference circuit 22b at its negative input. Error amplifier 38 is responsive to feedback from first transistor 36 through resistor 40 which is also coupled to resistor 42 at node B. In operation, the voltage at node A is adjusted until the voltage at node B is equal to the reference voltage from bandgap reference circuit 22b. The voltage at node A can be adjusted externally by changing the ratio of resistors 40 and 42. Error amplifier 38 adjusts the gate voltage of first transistor 36 until its two inputs, one from bandgap reference circuit 22b and the other from node B, are equal to each other. When more current is drawn from external amplifier 14, the gate voltage of transistor 36 is adjusted accordingly to allow more current to be sunk by amplifier 14 while keeping the regulated output voltage provided to the drain of amplifier 14 constant.

Sense circuit 16b includes a second transistor 44 having its gate coupled to the gate of transistor 36 for providing a scaled-down replica of the output current of transistor 36. To provide a scaled-down reference of the output current from transistor 36, the transconductance of transistor 36 is significantly larger than the transconductance of transistor 44. For example, transistor 36 may have transconductance that is 200 times that of transistor 44. Preferably, transistors 36 and 44 are on the same integrated circuit and have their gain matched by a predetermined amount. Current sense circuit 16b also includes a sense resistor 46 responsive to transistor 44 for providing a voltage corresponding to the scaled-down replica of the input current to amplifier 14. Amplifier control circuit 18b is coupled to sense resistor 46 and is responsive to the voltage across resistor 46 for controlling the control voltage of amplifier 14. In this manner, by sensing the voltage across sense resistor 46 which is representative of a scaled-down replica of the input current to amplifier 14, a low value sense resistor is not required in series with the drain or source of amplifier 14, thereby eliminating the disadvantages associated with using such a sense resistor in series with the external amplifier.

LDO 12b also includes a foldback circuit 48 coupled to both the drain and source of transistor 36 for monitoring the current passing through transistor 36 and clamping the gate voltage of transistor 36 if excessive current starts flowing through transistor 36, thereby keeping the power dissipated in transistor 36 at a safe value.

Switch 20b, which is coupled between transistor 36 and amplifier 14, includes a switching transistor 50 for opening and closing the connection between transistor 36 and amplifier 14. Level shifter circuit 52 biases switching transistor 50. Drain current check circuit 54 monitors the current through switching transistor 50 and generates an output signal when the drain current to amplifier 14 is stabilized.

Figure 4:
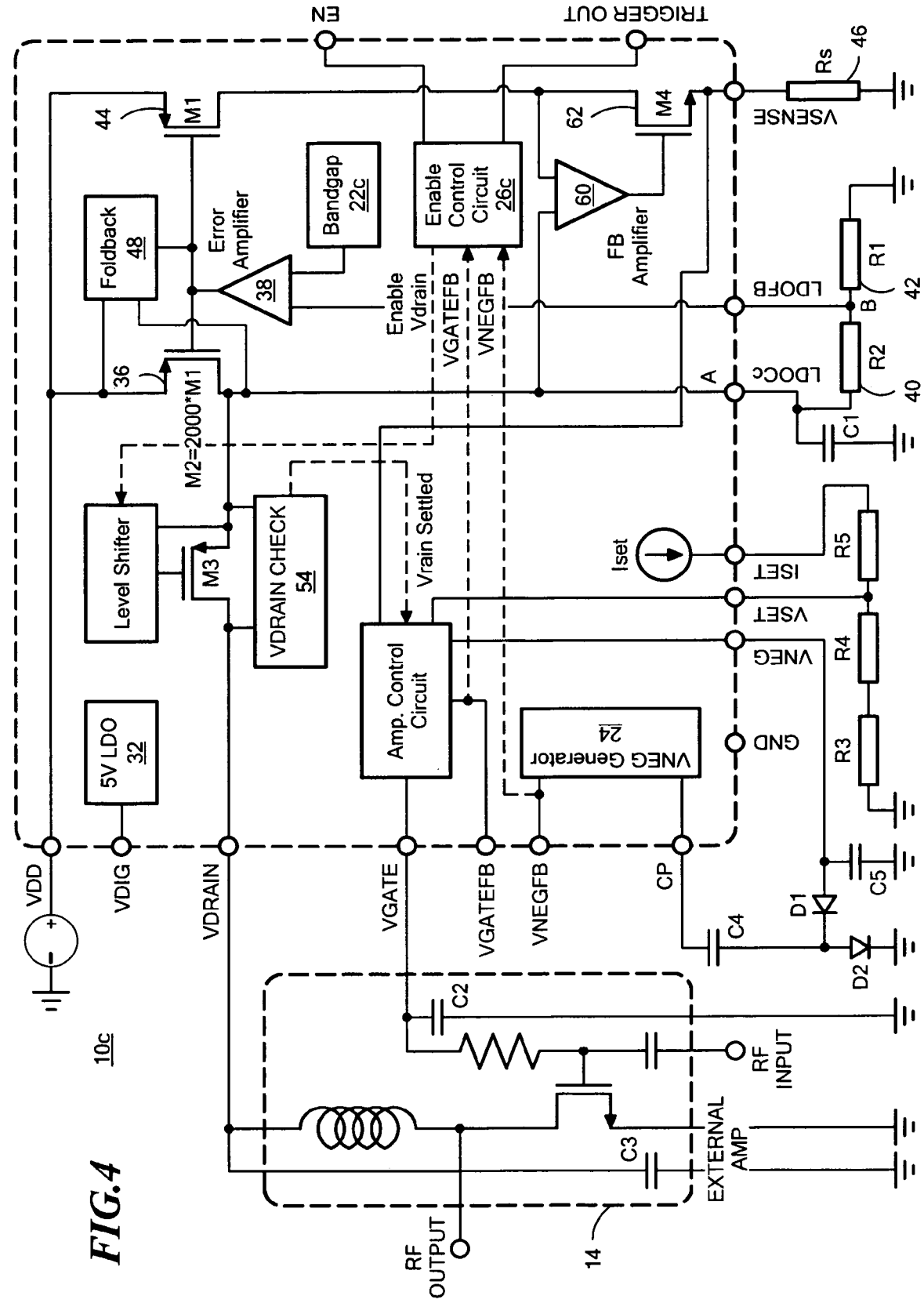
FIG. 4 is a schematic diagram of another embodiment of the active bias control circuit of FIG. 2 which includes a feedback amplifier.

In another embodiment, active bias control circuit 10c, FIG. 4, includes a feedback amplifier 60 connected to the drains of transistors 36 and 44. An additional transistor 62 is located in series between transistor 44 and sense resistor 46, and has its gate connected to the output of feedback amplifier 60. Due to the feedback created by feedback amplifier 60, the voltage on the drains of transistors 36 and 44 equal to each other which forces the voltage drop across transistors 36 and 44 to be equal to each other. This feedback improves the current scaling accuracy of the current of transistors 36 and 44 when LDO 12b is forced to have a very low drop off voltage and transistors 36 and 44 are forced to work in the triode region. Transistor 62 is shown as being an NMOS transistor, however, this is not a limitation of the invention as a PMOS transistor could also be used.

In order not to damage amplifier 14, it is preferable to keep the amplifier at pinch off until the drain voltage is stabilized. When the drain voltage is stabilized, the gate voltage of amplifier 14 is increased to obtain the desired quiescent current. To accomplish this, active bias control circuit 10c uses enable control circuit 26c to monitor different components of circuit 10c to enable amplifier 14 in an appropriate manner and to also shut-off amplifier 14 in the event of a system failure. User-accessible pins VNEGFB and VGATEFB may each serve a dual purpose in that they can be shorted to ground to configure the various operating mode of the controller, as described below. They can also be used to adjust the output voltage level of the negative bias generation in the Depletion Master mode or the trigger point for the gate voltage VSET threshold for power-up sequencing in the Depletion Slave mode.

Figure 5:
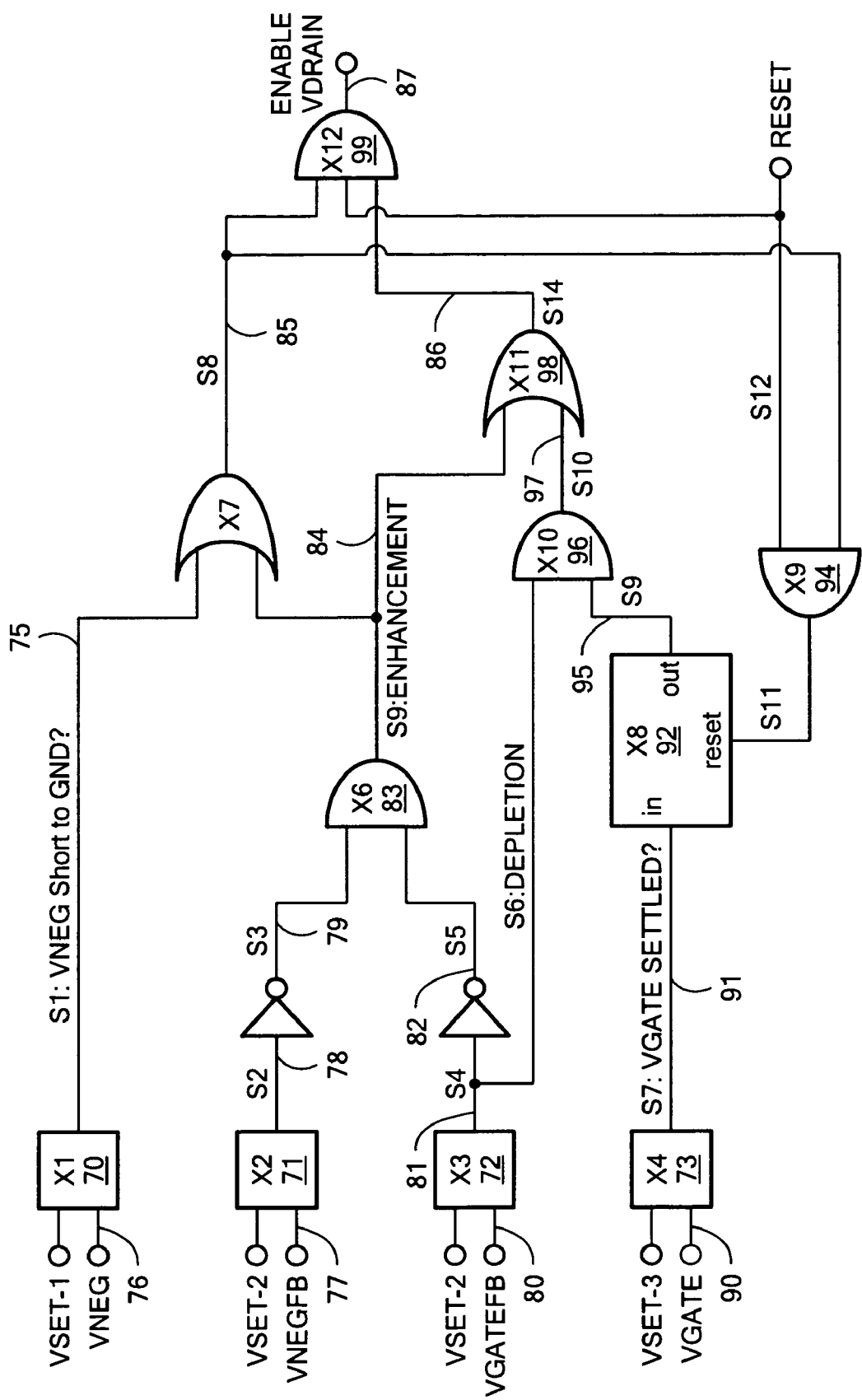
FIG. 5 is a schematic diagram of the enable control circuit of the active bias control circuits of FIGS. 3 and 4.

One embodiment of enable control circuit 26d, FIG. 5, includes four comparators 70-74. Comparator 70 is responsive to the VNEG signal on line 76 and the VSET-1 signal. Signals VSET-1 through VSET-3 are generated by bandgap generator 22. If the VNEG signal is above VSET-1, comparator 70 generates LOW on line 75 which indicates a short to ground on line 76.

Comparator 71 is responsive to the VNEGFB signal on line 77, which is coupled to a user accessible terminal, and the VSET-2 signal. If the VNEGFB signal on line 77 is shorted to ground which indicates the user's intention to turn off negative voltage generator 24, the output of comparator 71 goes LOW on line 78 and line 79 goes HIGH. This turns of negative voltage generator 24 setting the system either in an ENHANCEMENT mode or a DEPLETION SLAVE mode. If line 77 is not grounded, line 78 goes HIGH and line 79 goes LOW placing the system in a DEPLETION MASTER mode, turning on negative voltage generator 24.

Comparator 72 is responsive to the VGATEFB signal on line 80, which is also coupled to a user accessible terminal, and the VSET-2 signal. If line 80 is shorted to ground which indicates the user's intention to put the system in the ENHANCEMENT mode, the output of comparator 74 goes LOW on line 81 and line 82 goes HIGH. If line 80 is not grounded, line 81 goes HIGH and line 82 goes low, placing the system in a DEPLETION mode.

AND gate 83 is responsive to the signals on lines 79 and 82. If the signals on lines 79 and 82 are HIGH (both VNEGFB on line 80 and VGATEFB on line 77 are shorted to ground), line 84 goes high placing the system in the ENHANCEMENT mode. If line 84 is HIGH, line 85 goes HIGH, 86 goes HIGH making the output on line 87 go HIGH, which provides an ENABLE VDRAIN signal to turn on the system. If line 84 is low, the system is in DEPLETION MODE and the ENABLE VDRAIN signal on line 87 needs the information from the other comparators to go HIGH to enable the system.

Comparator 73 is responsive to the VGATE signal on line 90 and the VSET-3 signal. When the VGATE signal is lower than VSET-3, the signal on line 91 goes HIGH which indicates that VGATE has settled and achieved a predetermined value.

LATCH 92 is responsive to the signal on line 91. Its output value on signal line 95 stays LOW, until its input on signal line 91 goes HIGH. When line 91 goes high, line 95 goes HIGH and stays HIGH regardless of the value of line 91 until cleared to LOW by a LOW signal on its reset input of latch 92. AND gate 94 is responsive to the reset input and line 85 and generates a HIGH if both these lines are HIGH. AND gate 96 is responsive to the signals on lines 81 and 95 and generates a HIGH signal on 97 when the system is in the DEPLETION MODE and the VNEG and VGATE signals have settled. OR gate 98 is responsive to the signals on lines 84 and 97 and generates a HIGH signal on line 86 when the system is in the ENHANCEMENT mode or if the system is in the DEPLETION mode and the VNEG and VGATE signals have settled. AND gate 99 is responsive to the signal on lines 85 and 86 and the reset input and generates a HIGH signal on line 87 to provide an ENABLE VDRAIN signal when lines 85 and 86 and the reset input go HIGH.

To summarize, in order for the ENABLE VDRAIN signal to go HIGH on line 87 to enable the drain current, one of these conditions should be satisfied: 1) the system is in ENHANCEMENT MODE and the RESET line is HIGH; or 2) the system is in DEPLETION MODE, the VGATE signal has settled down and the VNEG signal is not shorted to ground and the RESET line is HIGH.

Figure 6:
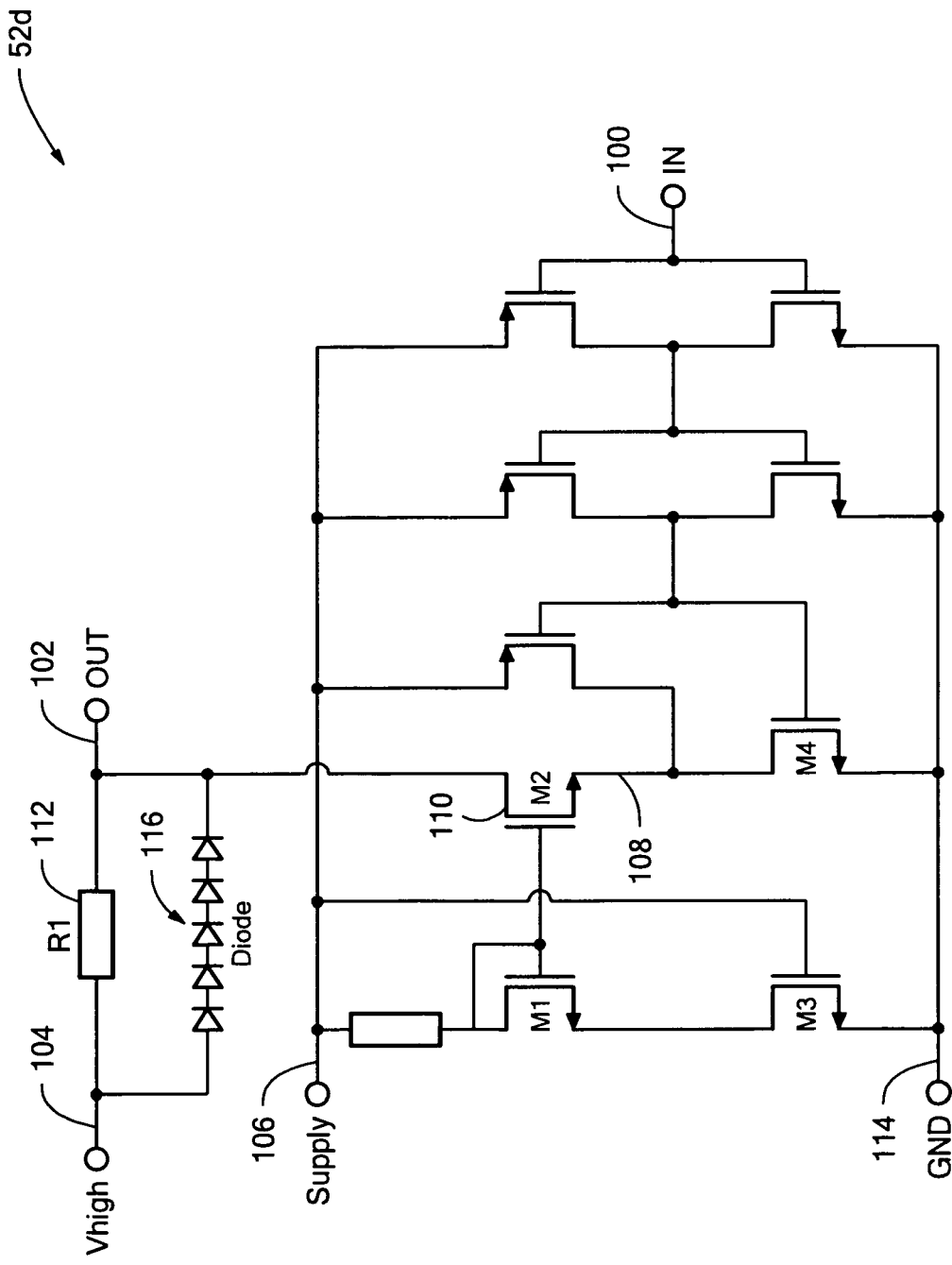
FIG. 6 is a schematic diagram of the level shifter of the above bias control circuits of FIGS. 3 and 4.

The output of enable control circuit 26d is provided to level shifter 52, FIG. 3. One embodiment of level shifter 52d is shown in FIG. 6. Level shifter 52d receives input signal on line 100 and generates an output signal on line 102 which is supplied to the gate of switching transistor 50, FIG. 3. Line 104 is connected to the output of LDO at 12b, such as at node A, to sense its output voltage. The supply voltage provided to level shifter 52 on line 106 is typically 5 V.

When the input 100 is low, node 108 is pulled up to the voltage on supply line 106, which turns off transistor 110. When transistor 110 is off, no current is flowing through resistor 112. The output on line 102 becomes equal to the voltage Vhigh on line 104, thereby turning off switching transistor 50, FIG. 3.

When the input voltage on line 100 is high, node 108 is pulled down to ground on line 114, which turns transistor 110 on. The voltage drop across resistor 112 then becomes sufficient to turn on switching transistor 50. The series of diodes 116 is provided to clamp the gate to source voltage of switching transistor 50 to a sufficiently safe value.

Figure 7:
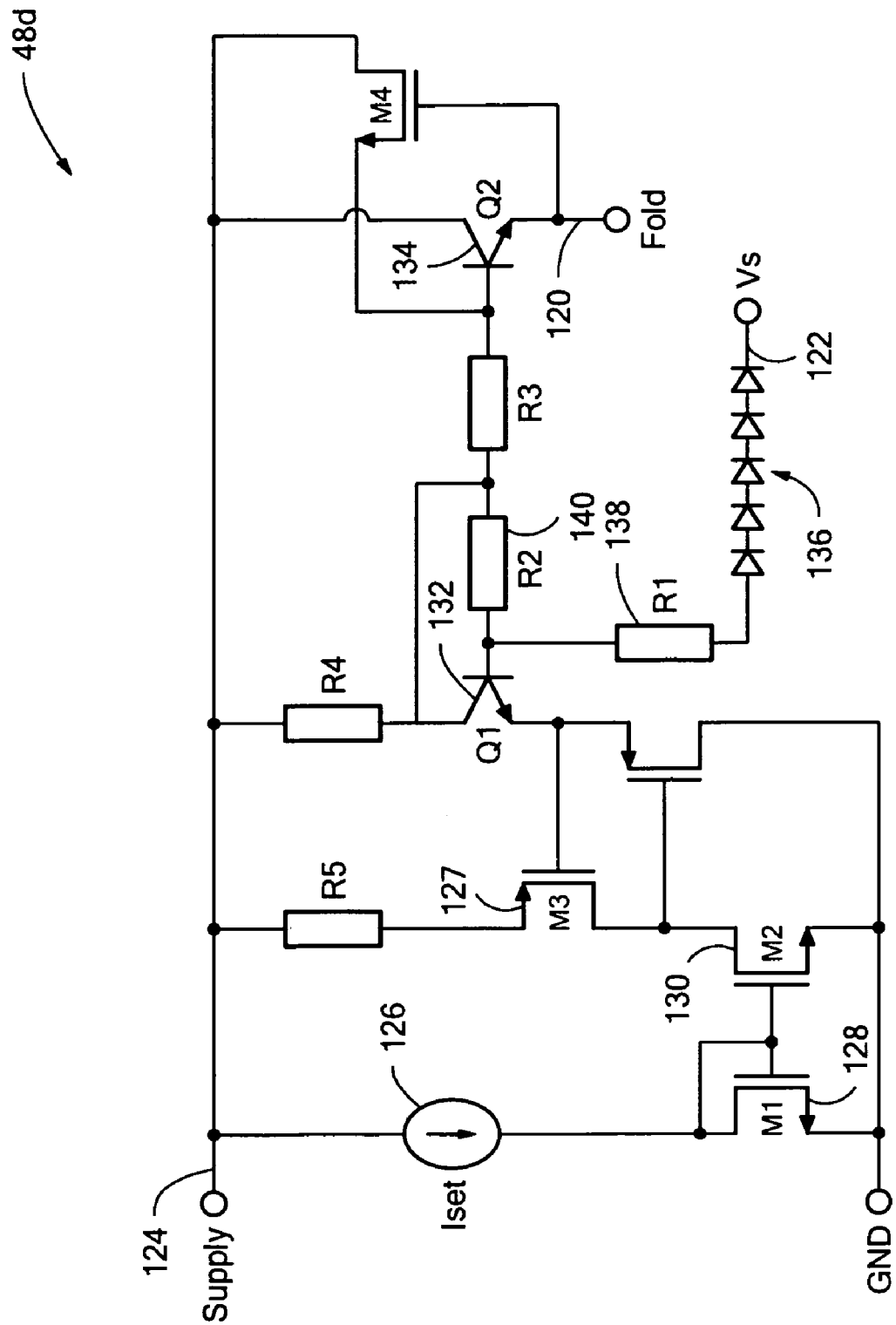
FIG. 7 is a schematic diagram of the foldback circuit of the active bias control circuits of FIGS. 3 and 4.

Foldback circuit 48d, FIG. 7, clamps the control voltage to transistor 36 when its power dissipation exceeds a predetermined threshold to prevent damage to the circuitry. By clamping the control voltage of pass transistor 36, the maximum current passing through the pass transistor is maintained below a predetermined value as a function of the voltage across transistor 36.

The output of foldback circuit 48b is on line 120 which is connected to the gate of pass transistor 36. Line 122 of foldback circuit 48d is connected to the drain of transistor 36, which is also the output of LDO 12b to sense its output voltage value. Line 124 is connected to the VDD supply and drain of pass transistor 36. The maximum current through pass transistor 36 is determined by a current generator Iset 126. The current through Iset 126 is mirrored through transistor 127 by the current mirror comprised of transistors 128 and 130. Due to the feedback generated by transistors 132 and 134, if the current passing through pass transistor 36 exceeds 2000 times the current of current generator 126, transistor 134 pulls the gate of pass transistor 36 to the voltage of VDD on line 124, thereby clamping the current through pass transistor 36. Diode string 136 and the resistance division created by resistors 138 and 140 set the scale back ratio of the foldback current.

Figure 8:
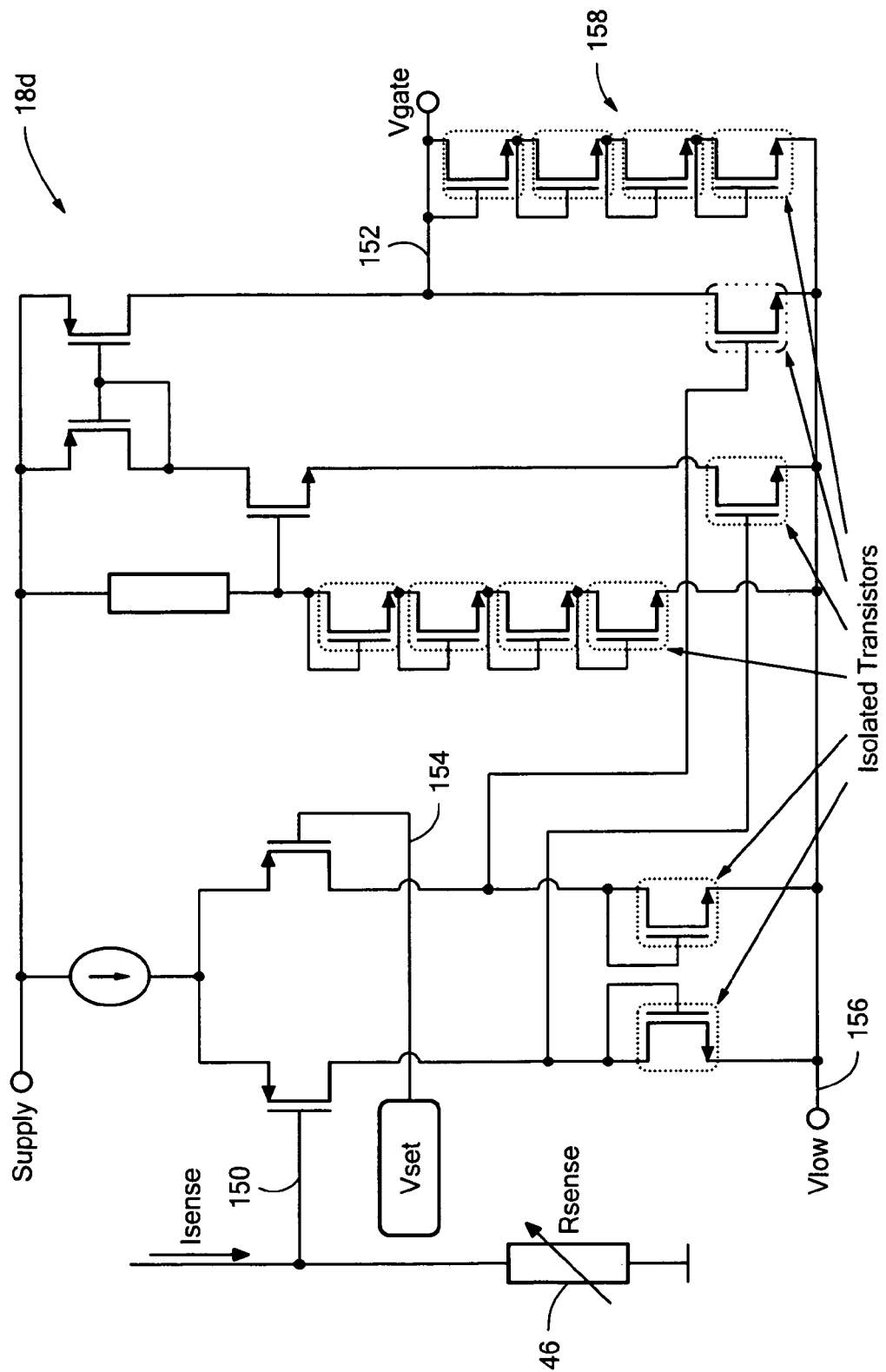
FIG. 8 is a schematic diagram of the amplifier control circuit of the active bias control circuits of FIGS. 3 and 4.

Amplifier control circuit 18*b*, FIG. 8, is responsive to the voltage across sense resistor 46, which provides a scaled down replica of the input current to the amplifier 14. The voltage of sense resistor 46 is sensed on line 150. Amplifier control circuit 18*d* adjusts its output on line 152 until the voltage from Vset on line 154 is equal to the sensed voltage on line 150.

When the active bias control circuit 10*b* is set to bias a depletion mode device, line 156 is connected to a negative voltage supply. The output 152 of active bias control circuit 10*b* is maintained at the voltage value on line 156 until the system is enabled, which keeps the depletion mode device at pinch off. When the system is enabled, the output 152 is increased until a desired quiescent bias is achieved. The shunt transistors 158 connected between output 158 and line 156 clamp the output voltage on line 152 about 4 V above the voltage on line 156.

When active bias control circuit is set to bias enhancement mode device, line 156 is connected to ground which maintains the output 152 at ground until the system is disabled, which keeps the enhancement mode device at pinch off. When the system is enabled, the output voltage on line 152 is increased until the quiescent bias is achieved.

Since the active bias control circuit 10*b* can bias both enhancement and depletion mode devices, amplifier control circuit 18*d* is preferably capable of generating both negative and positive output voltages on line 152. Typical CMOS transistors may not allow negative voltages with respect to an integrated circuit substrate to be applied. To allow the use of negative voltages, isolated NMOS transistors that can withstand negative voltages values are preferably used.

Figure 9:
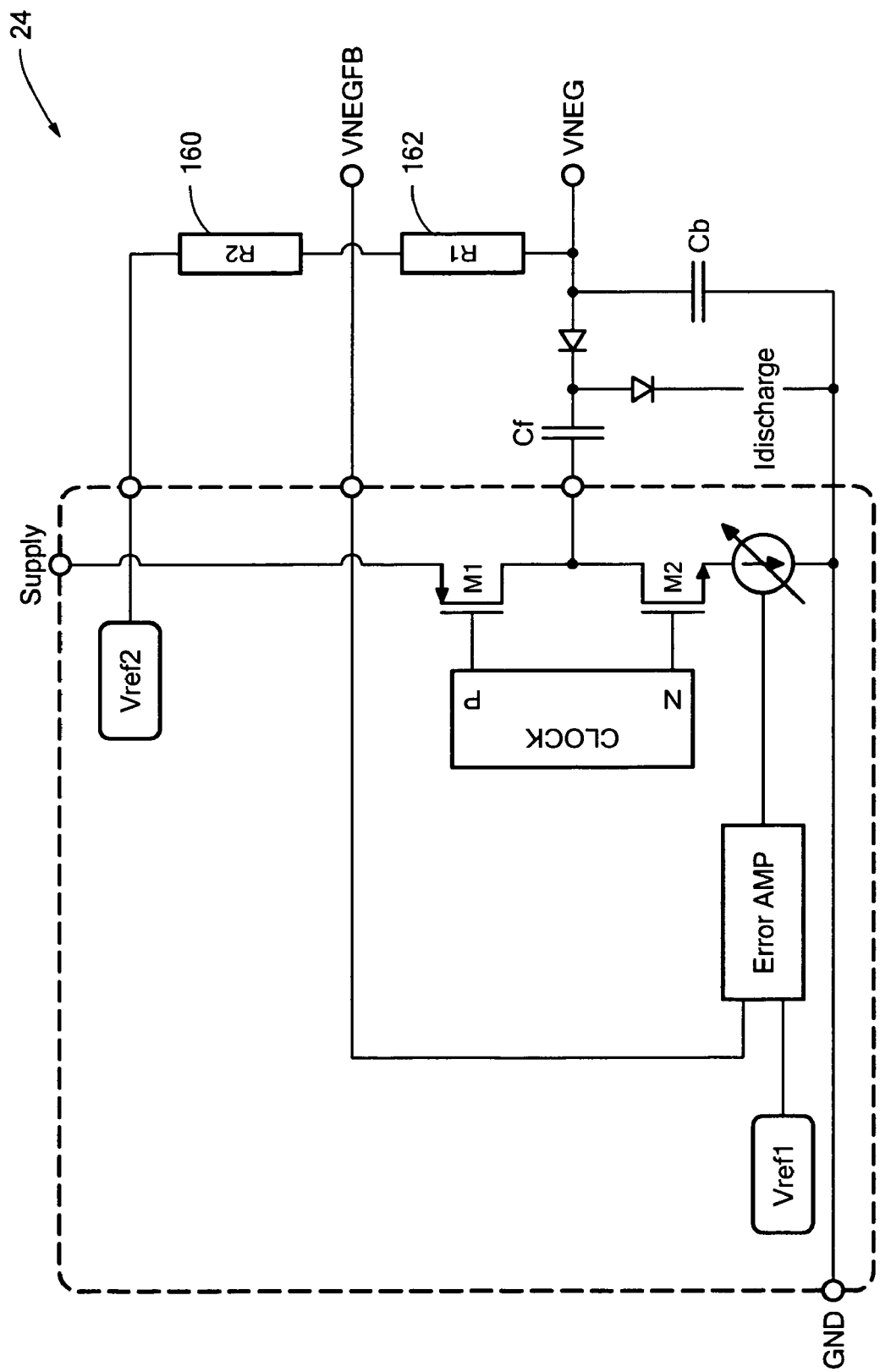
FIG. 9 is a schematic diagram of the negative voltage generator of the active bias control circuits of FIGS. 3 and 4.
Figure 10:
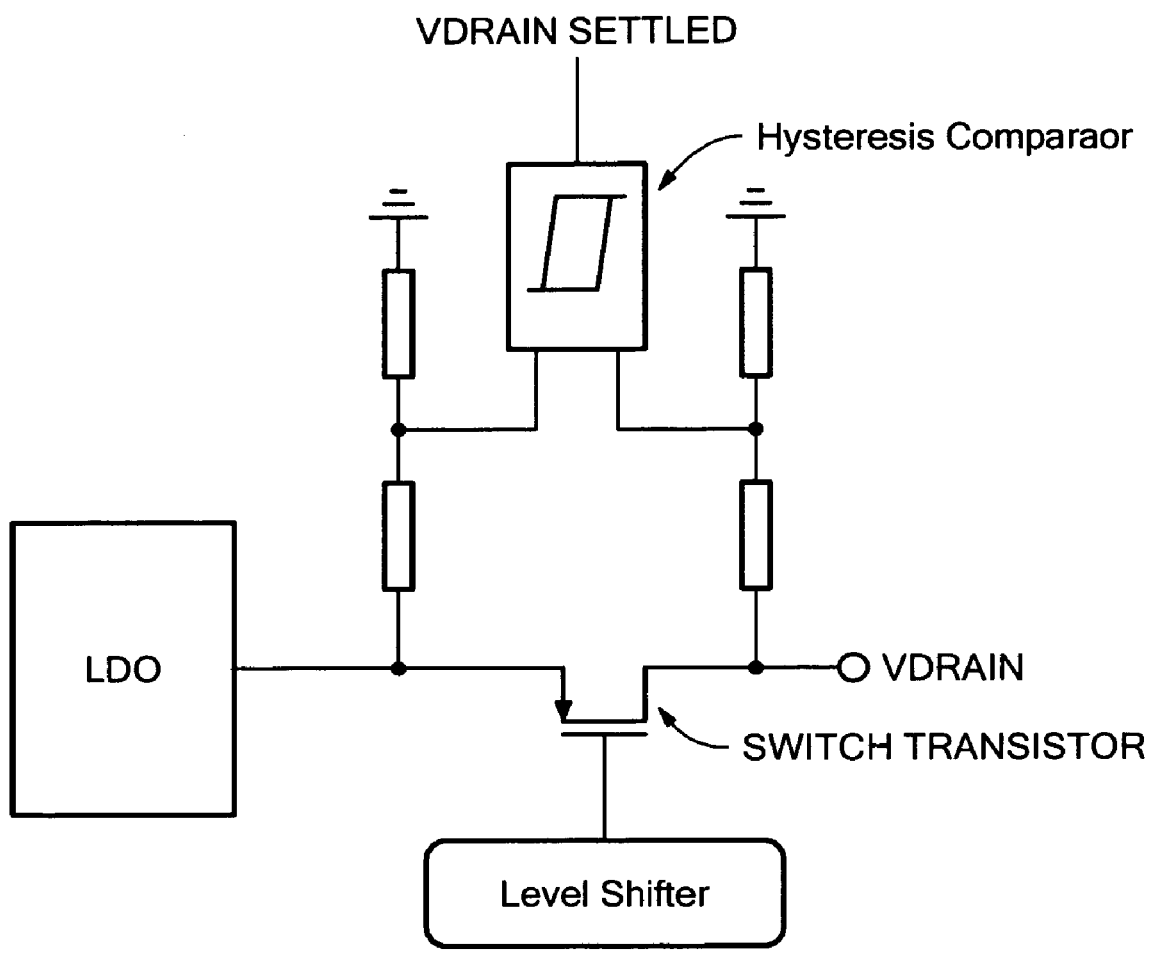
FIG. 10 is a schematic diagram of a drain current check circuit for the active bias circuits of FIGS. 3 and 4.

One embodiment of negative voltage generator 24, FIG. 9, includes resistors 160 and 162 which can be located either on chip or off chip or a combination of both to adjust the value of voltage output of generator 24. If these resistors are on-chip, they will set a default output voltage level for generator 24 in Depletion Slave Mode. The user may adjust this level by adding an external resistor connected to the VNEGFB pin shown in FIGS. 3, 4 and 9. The same resistor value would then also be connected to the VGATEFB pin in FIGS. 3, 4 to provide the correct VSET thresholds for the power-up sequencing function as described below. FIG. 10 illustrates an embodiment of the drain current check circuit 54 of circuits 10*b* and 10*c*.

As noted in the Background of the Invention above, an important consideration for amplifiers is the proper power up sequence to be applied to the amplifier so that excess current will not pass through the amplifier damaging it. A method for power up sequencing of an active bias controller for an external amplifier shown in FIG. 11 begins at step 170 with powering up the amplifier. The control voltage of the amplifier is adjusted at step 172 to bring the amplifier control voltage below pinch off. A first enable signal is generated at step 174 to enable drain current to flow to the amplifier. When it is determined at step 176 that the drain voltage has stabilized, a second enable signal is generated. In response to the second enable signal, the amplifier current control circuit is enabled at step 178 to achieve a predetermined amplifier input current. A trigger out signal may also be generated when the control circuit is enabled.

Figure 11:
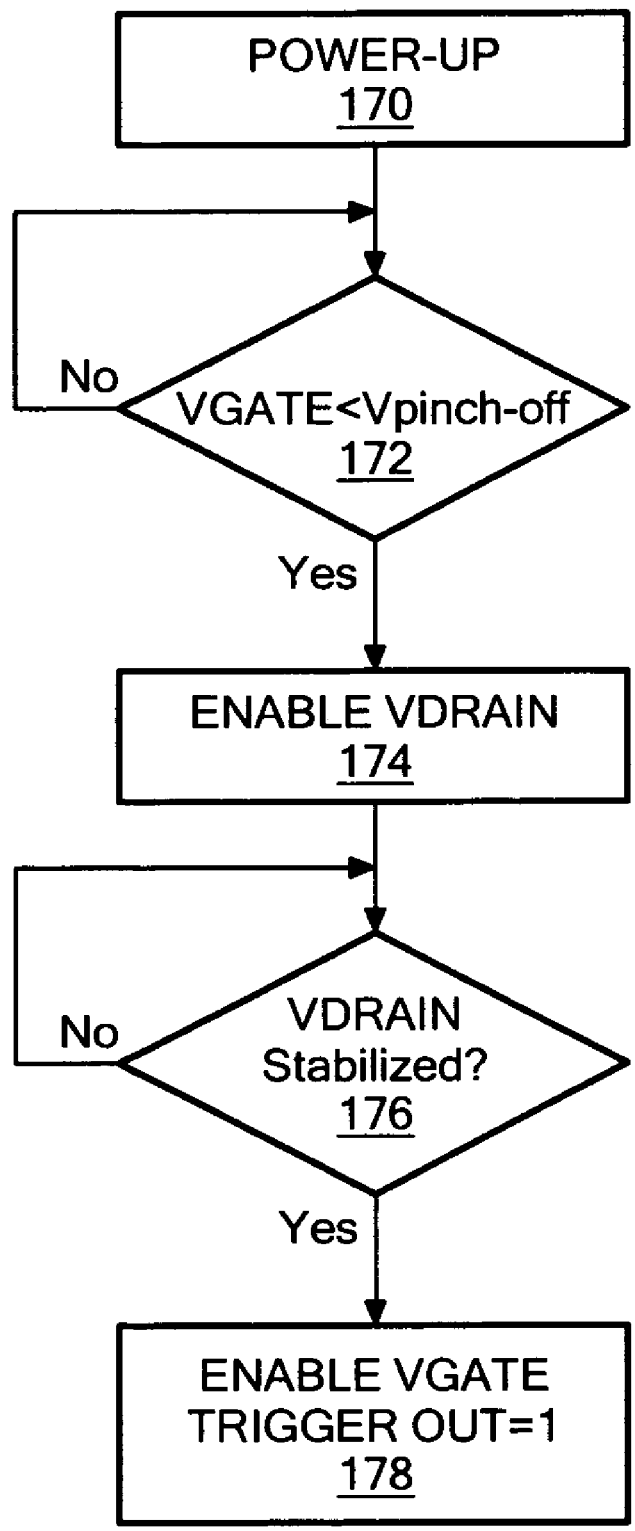
FIG. 11 is a flowchart showing one embodiment of a method of power up sequencing for the active bias control circuits of FIGS. 3 and 4.
Figure 12A:
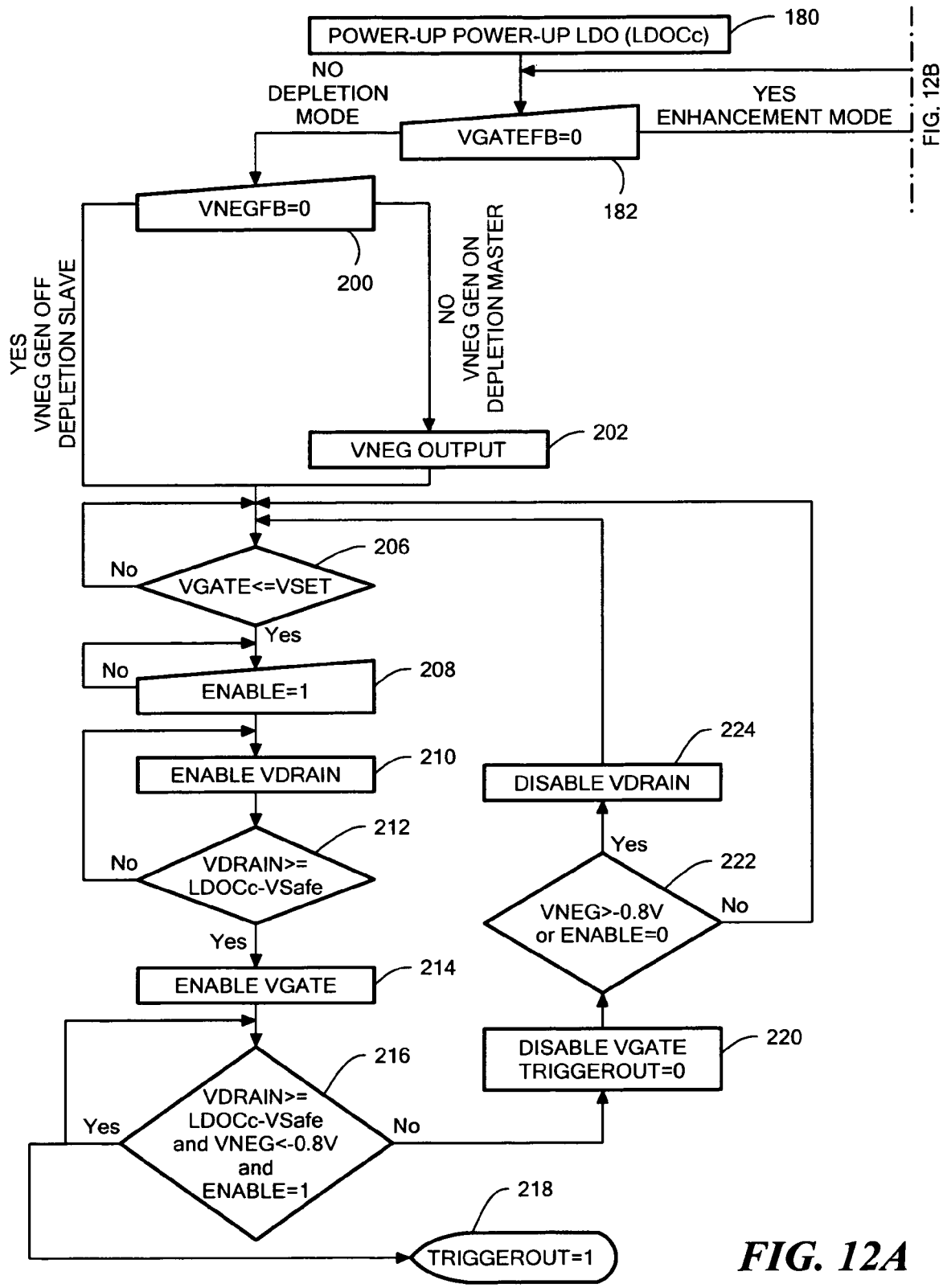
FIG. 12 is another embodiment of a method of power up sequencing for the active bias control circuits of FIGS. 3 and 4.
Figure 12B:
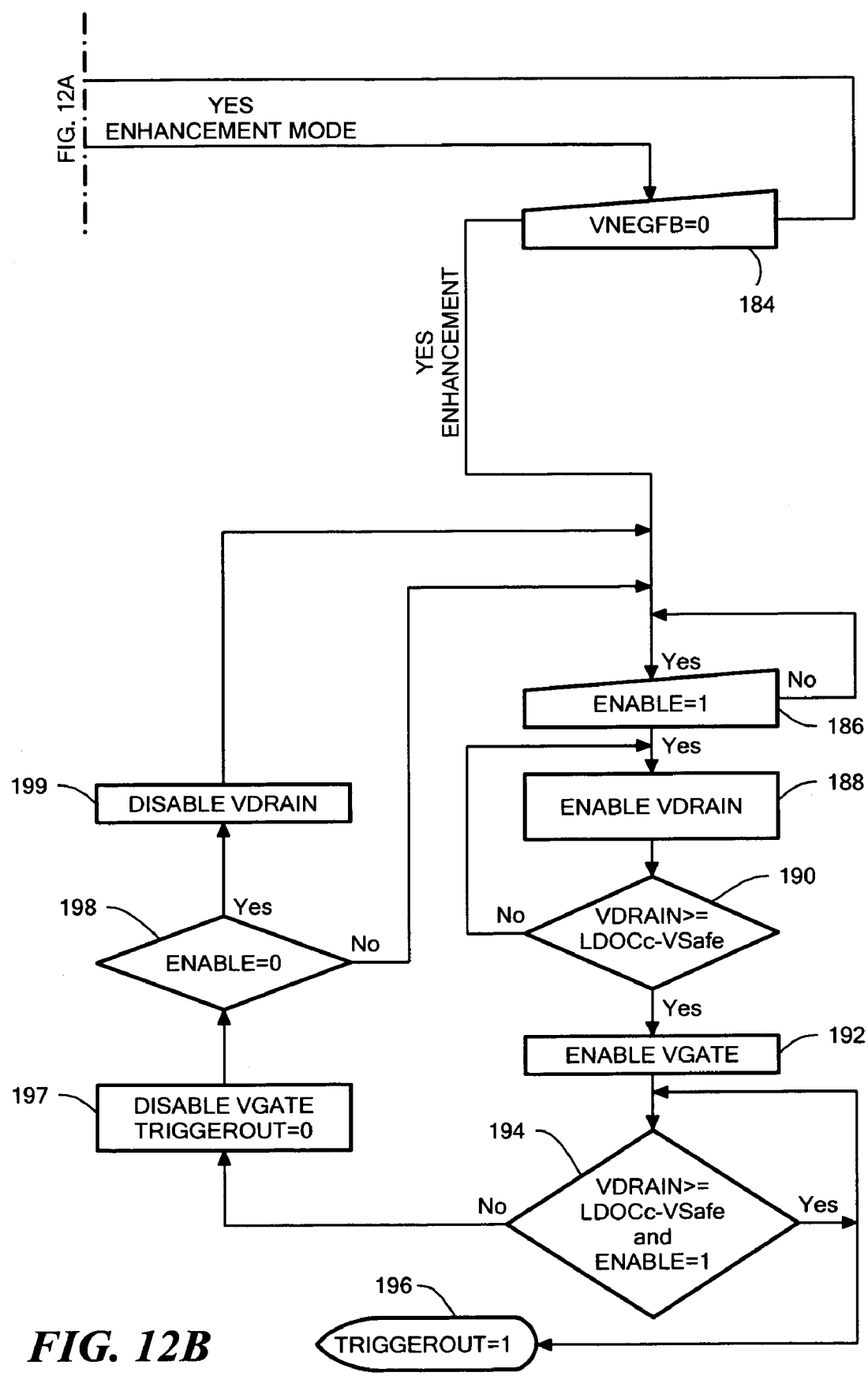
Figure 13:
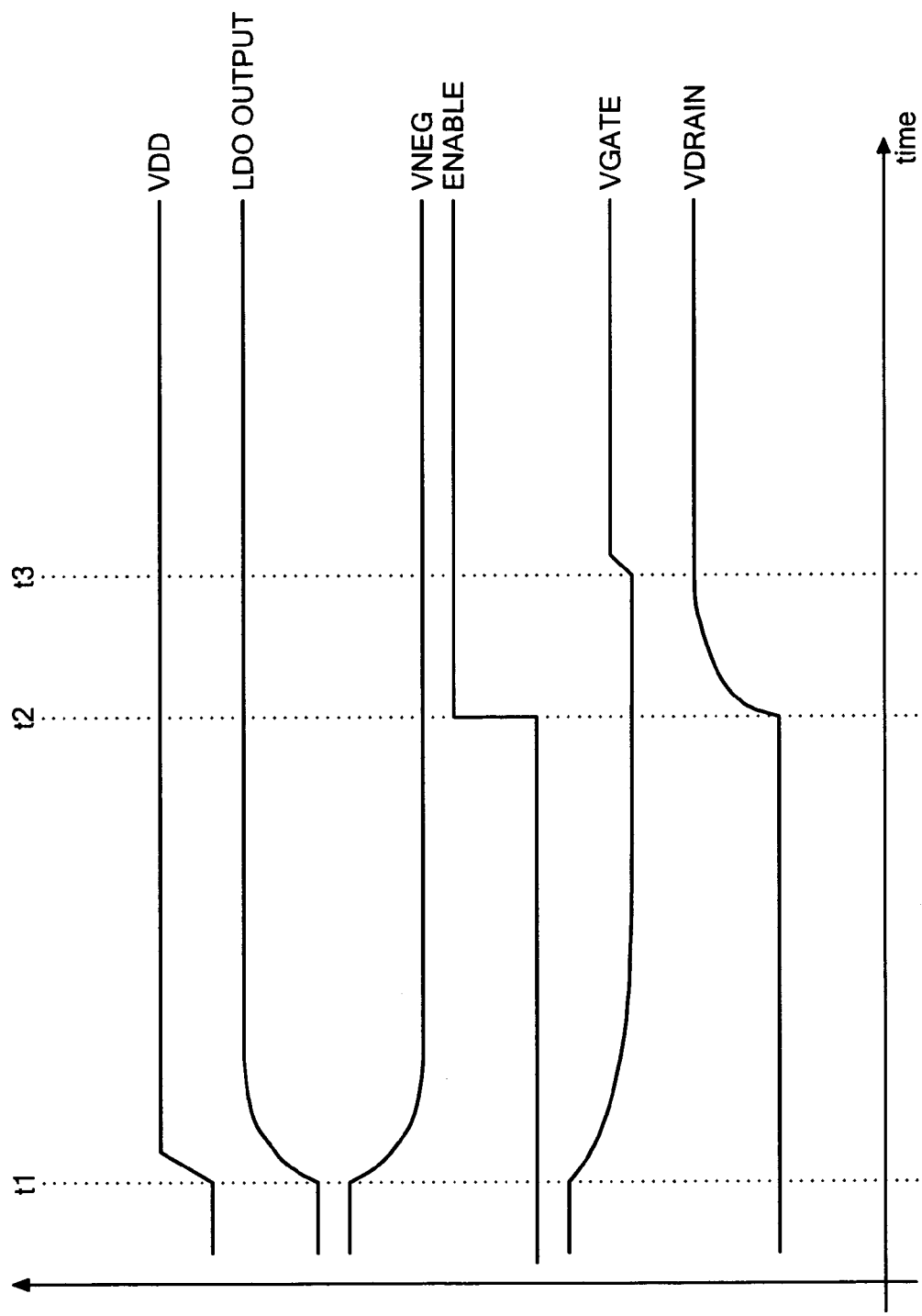
FIG. 13 is a timing diagram showing the voltages of several output signals during the method of FIG. 12.

Another embodiment of a method for power up sequencing of an active bias controller for an external amplifier is shown in the flowchart of FIG. 11 and the timing diagram of FIG. 12. This embodiment includes the features of short circuit protection and mode selection through user accessible inputs VNEGFB and VGATEFB. After powering up the amplifier at step 180, LDO 12 is turned on and generates an output (LDOCc) at time t1. At step 182, the system checks if VGATEFB input is shorted to ground. If it is grounded by the user, the system is selected to drive an ENHANCEMENT mode amplifier. The system checks at step 184 if VNEGFB input is grounded. If it is not grounded, the system waits since this mode of operation is not allowed. If the VNEGFB input is grounded, the system checks at step 186 if the user accessible pin ENABLE is HIGH. When it is HIGH at time t2, the VDRAIN signal is enabled at step 188. The drain voltage (VDRAIN) output is compared with respect to a LDOCc-Vsafe value at step 190. When VDRAIN is larger or equal to LDOCc-Vsafe, the gate voltage (VGATE) is enabled at step 192 and at time t3 turning on the active bias controller. During the operation, VDRAIN and ENABLE are checked continuously at step 194. A TRIGGER OUT signal is generated at step 196 when VGATE is enabled. If VDRAIN falls below the threshold or if ENABLE pin is taken to LOW, VGATE is DISABLED and TRIGGER OUT is taken LOW at step 197. If ENABLE is LOW at step 198, VDRAIN is disabled at step 199 and system goes back to the initial ENABLE state waiting for user input. If ENABLE is not LOW, there is a short condition, system waits until the short condition is cleared to turn on VGATE.

If at step 182 it is determined that VGATE is not grounded, the system is taken to DEPLETION mode. The system checks if VNEGFB is grounded at step 200. If it is grounded the system is taken to DEPLETION SLAVE mode, the negative voltage generator is disabled. If it is not grounded the system is taken to DEPLETION MASTER mode, and at time t1 negative voltage generator 24 is enabled at 202. VGATE is checked against predetermined value VSET at step 206. When VGATE voltage drops below VSET the system waits at step 208 for a HIGH signal on ENABLE. When ENABLE is high, VDRAIN is enabled at step 210. The VDRAIN output is compared with respect to a LDOCc-Vsafe value at step 212. When VDRAIN is larger or equal to LDOCc-Vsafe VGATE is enabled at step 214 turning on the active bias controller, generating a HIGH TRIGGER OUT signal at 218. During the operation, VDRAIN, VNEG and ENABLE are checked continuously at step 216. VNEG is continuously checked against an upper threshold to detect any inadvertent short to ground at VNEG. If VDRAIN falls below the threshold, or if VNEG rises higher than −0.8V, or if ENABLE is not HIGH, VGATE is DISABLED and TRIGGER OUT is taken LOW at step 220.

If VNEG>−0.8V or ENABLE is LOW at step 222, VDRAIN is disabled at step 224 and the system goes back to the initial state at step 206. Otherwise, there is a short condition on VDRAIN and the system waits until the short condition is cleared to turn on VGATE.

Figure 14A:
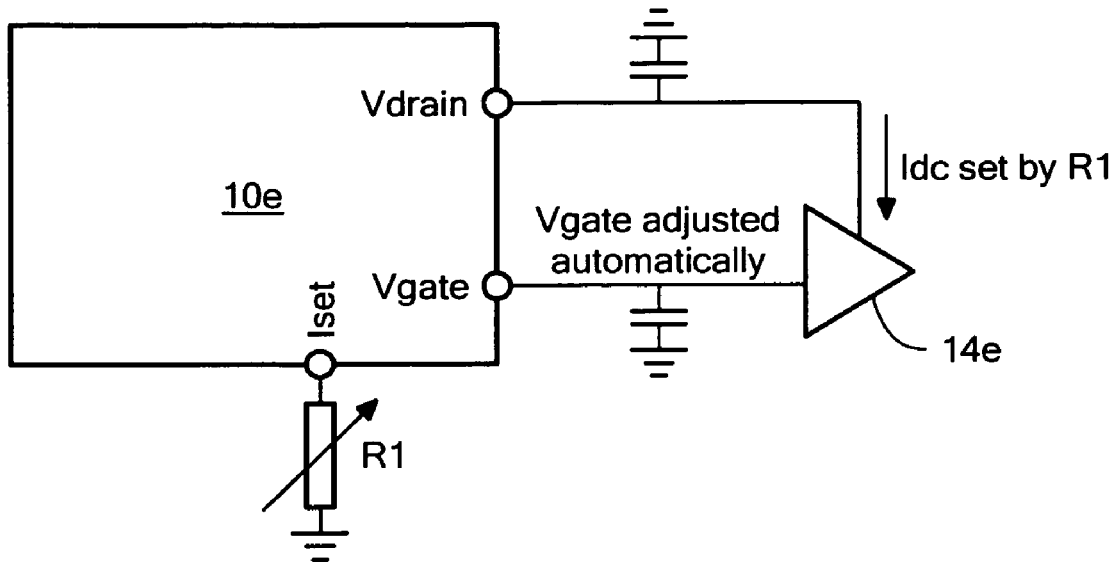
FIGS. 14A and 14B are schematic diagrams illustrating the operation of the active bias control circuit of FIGS. 3 and 4 to obtain open and closed loop operation, respectively.
Figure 14B:
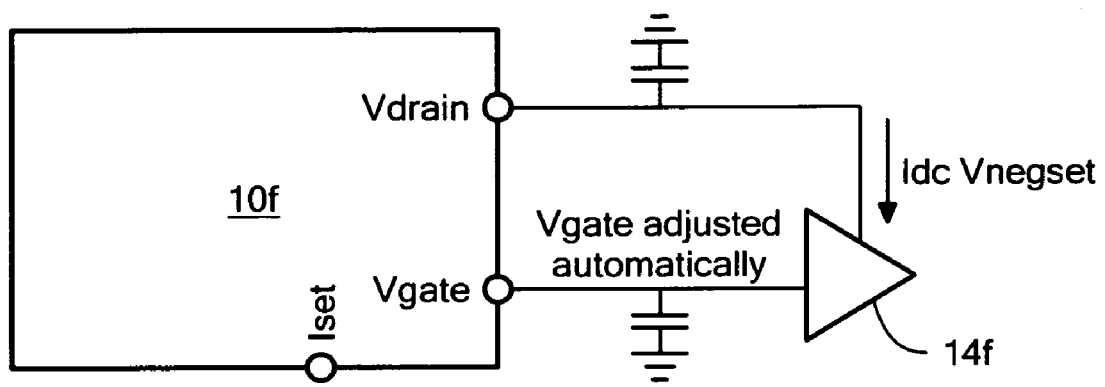

Referring to FIGS. 14A and 14B, the amplifier control circuit of active bias control circuit 10*e* may be configured to provide either a fixed control voltage to an amplifier 14*e* or adjust control voltage in response to the determined input current to keep the input current to the amplifier current as described above. In FIG. 14A, circuit 10*e* is operated in a closed-loop mode and adjusts the control voltage of amplifier 14*e* in response to the input current to amplifier 14*e* to keep the input current constant. In FIG. 14B, circuit 10*f* is operated in an open loop mode in which pin Iset is left floating. When Iset is left floating, the voltage applied to the control terminal of amplifier 14*f* will be kept at a predetermined fixed control voltage such that the system can be used to bias an external amplifier without active feedback.

Figure 15A:
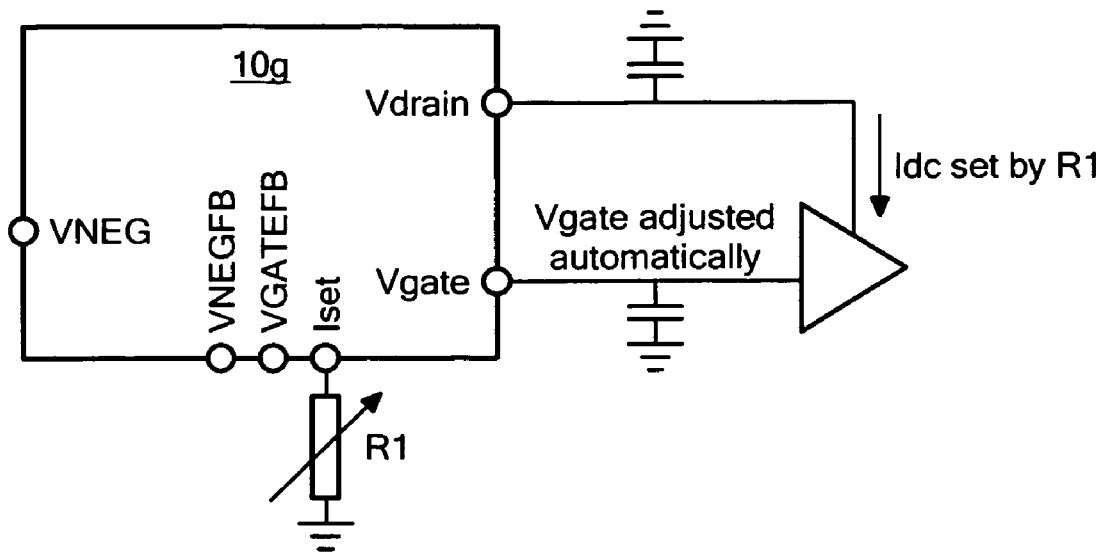
FIGS. 15A-D are schematic diagrams illustrating the operation for the active bias control circuits of FIGS. 3 and 4 to obtain different modes of operating including depletion mode with either internal or external VNEG voltages, enhancement mode, or to place the system in stand-by mode.
Figure 15B:
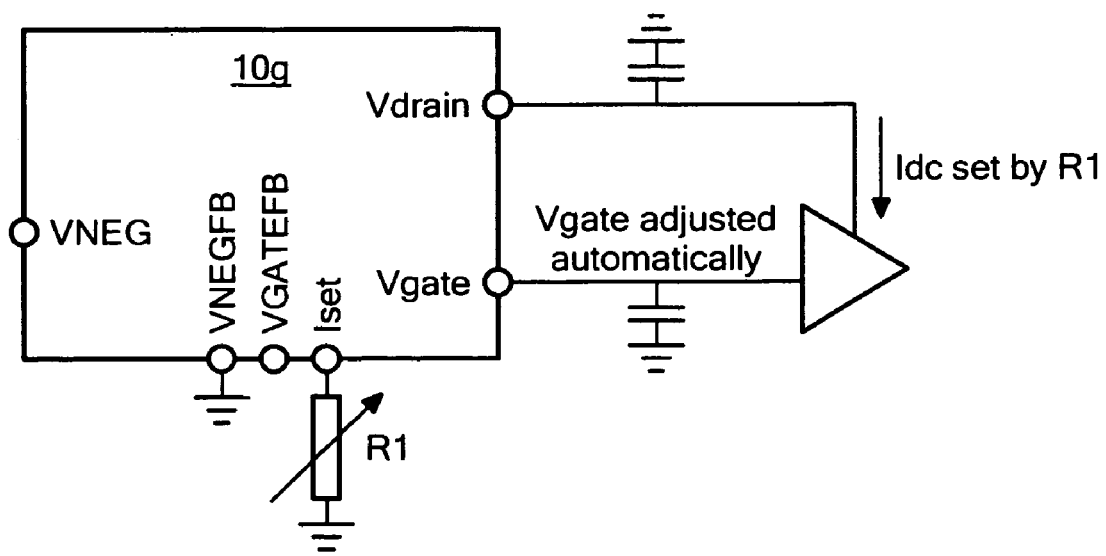
Figure 15C:
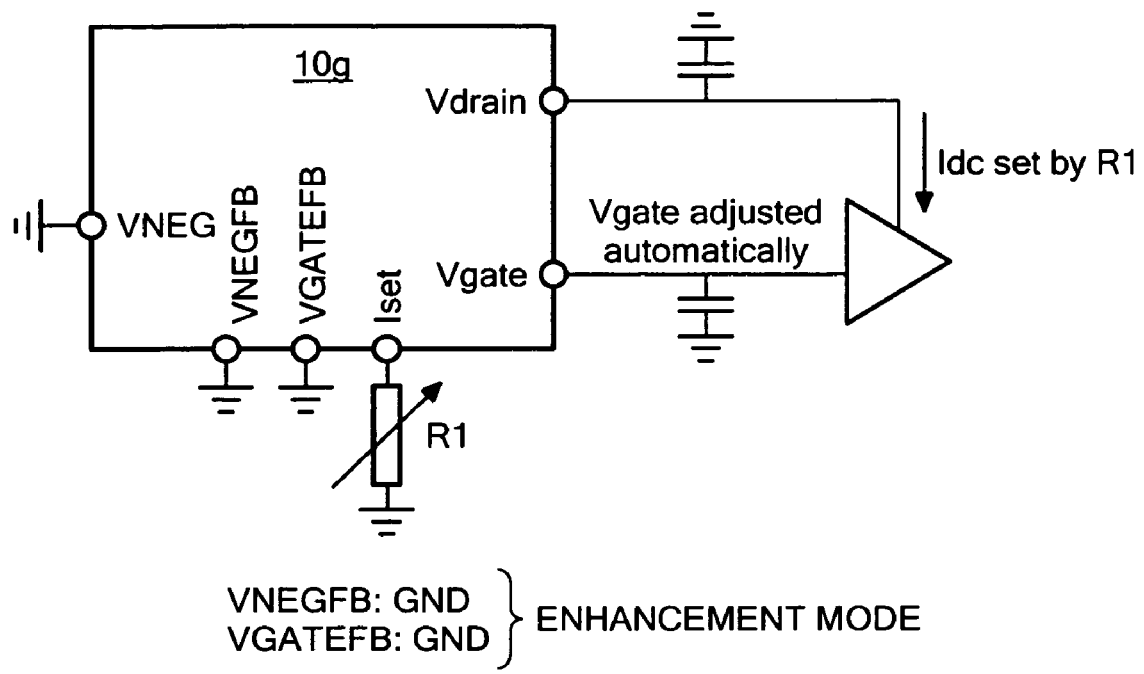
Figure 15D:
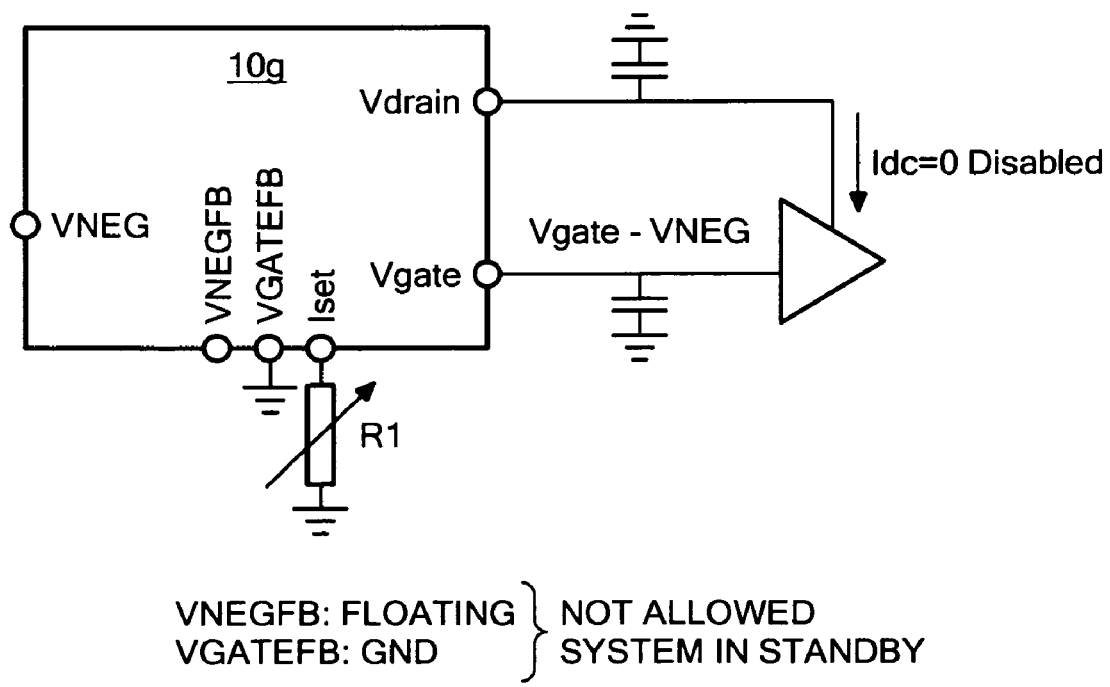

FIGS. 15A-15D illustrate how the active bias control circuit may be configured to provide the appropriate control voltage for an amplifier that includes either an enhancement mode or depletion mode device, and may be configured to either use an internal or external negative voltage supply. In FIG. 15A, when pin VNEGFB is left floating (i.e. a high signal) and a pin VGATEFB is left floating, negative voltage generator 24 is enabled and the system provides a control voltage for a depletion mode device. In FIG. 15B, when VNEGFB is shorted to ground (i.e. a low signal) and VGATEFB is left floating, negative voltage generator 24 is disabled, and the system provides a control voltage appropriate for a depletion mode device using an externally generated negative voltage. In FIG. 15C, when pin VNEGFB is shorted to ground and VGATEFB is shorted to ground, negative voltage generator 24 is disabled and the system provides the control voltage appropriate for an enhancement mode device. In FIG. 15B, when pin VNEGFB is left floating and VGATEFB is shorted to ground, negative voltage generator 24 is enabled but the active bias control circuit 10g is disabled and the system is placed in standby mode. This prevents the accidental biasing of enhancement mode devices with negative voltages.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An active bias control circuit for an amplifier, comprising:
   a low dropout regulator for providing a regulated voltage and an input current to the amplifier, the low dropout regulator including a first transistor for providing the input current to the amplifier, and an error amplifier responsive to a reference voltage and the first transistor;
   a current sense circuit responsive to the low dropout regulator and including a second transistor coupled to the first transistor and having a transconductance less than the first transistor for providing the scaled down replica of the output current of the first transistor for sensing a scaled down replica of the input current to the amplifier; and
   an amplifier control circuit for adjusting a control voltage to the amplifier in response to the sensed, scaled down replica of the input current to regulate the input current to the amplifier.

2. The active bias control circuit of claim 1, in which the current sense circuit further includes a sense resistor responsive to the second transistor for providing a voltage corresponding to the scaled down replica of the input current to the amplifier.

3. The active bias control circuit of claim 2, in which the amplifier control circuit is responsive to the voltage across the sense resistor for controlling the control voltage of the amplifier.

4. The active bias control circuit of claim 1, further including a switch coupled in series between the low dropout regulator and the input of the amplifier for switching off the input current to the amplifier.

5. The active bias control circuit of claim 4, in which the switch includes a switching transistor.

6. The active bias control circuit of claim 5, further including a level shifter for biasing the switching transistor.

7. The active bias control circuit of claim 1, in which the low dropout regulator further includes a bandgap reference circuit for generating the reference voltage.

8. The active bias control circuit of claim 1, in which the amplifier control circuit is configured to provide either a positive or negative control voltage.

9. The active bias control circuit of claim 1, in which the amplifier control circuit is configured to provide either a positive or negative control voltage.

10. The active bias control circuit of claim 1, in which the first and second transistors are on a same integrated circuit for matching one or more predetermined characteristics.

11. The active bias control circuit of claim 1, further including a second control circuit configured to enable the active bias control circuit.

12. The active bias control circuit of claim 1, in which the low dropout regulator further includes a foldback circuit for limiting the control voltage to the first transistor when the power dissipation of the first transistor exceeds a predetermined threshold.

13. The active bias control circuit of claim 11, in which any active circuitry of the circuit is on an integrated circuit chip, and in which the second control circuit is configured to:
   provide a control voltage for the amplifier including either an enhancement mode or depletion mode device,
   operate using a negative voltage supply generated either by the integrated circuit chip or externally, and/or
   provide either a fixed control voltage or adjust the control voltage in response to a determined input current to keep the input current to the amplifier constant.

14. The active bias control circuit of claim 13 in which the amplifier control circuit is configured externally by user accessible pins connected to the integrated circuit chip.

15. The active bias control circuit of claim 14 in which said user accessible pins are further used to adjust the negative voltage supply generated by the integrated circuit.

16. The active bias control circuit of claim 4, in which the circuit is configured to:
   control a control voltage of the amplifier to bring the amplifier control voltage below a pinch off level that turns off the amplifier;
   if the control voltage is below pinch off, generate a first enable signal to enable input current to flow to the amplifier;
   generate a second enable signal when a supply voltage is stabilized; and
   in response to the second enable signal, increase the control voltage to achieve a predetermined amplifier input current.

17. The active bias control circuit of claim 16 in which the amplifier control circuit is configured to generate a trigger out signal after the predetermined amplifier input current is achieved.

18. The active bias control circuit of claim 16 in which the first enable signal turns on a switch to enable the input current to flow to the amplifier.

19. The active bias control circuit of claim 16 in which the second enable signal turns on an amplifier control circuit to stabilize the supply voltage.

20. The active bias control circuit of claim 16 in which the amplifier input current is reduced to a level to prevent damage to circuitry if a supply terminal of the amplifier is shorted to ground.

21. The active bias control circuit of claim 2 further including:
    a feedback amplifier having its inputs coupled to the drains of the first and second transistors, and
    a transistor coupled between the second transistor and the sense resistor and having a control terminal responsive to an output of the feedback amplifier for improving the current scaling accuracy of the first and second transistors.

22. An active bias control circuit for an amplifier, comprising:
    a low dropout regulator for providing a regulated voltage and including a first transistor for providing an input current to the amplifier, and an error amplifier responsive to a reference voltage and the first transistor;
    a sense circuit including a second transistor having a control terminal coupled to a control terminal of the first transistor for providing and sensing the scaled down replica of the output current of the first transistor, the first and second transistors located on a same integrated circuit for matching one or more predetermined characteristics; and
    an amplifier control circuit for providing a control voltage to the amplifier and adjusting the control voltage of the amplifier in response to the sensed scaled down replica of the input current to keep the input current to the amplifier constant.

23. An active bias control circuit on an integrated circuit chip for biasing an amplifier, comprising:
    a low dropout regulator for providing a regulated voltage and an input current to the amplifier;
    a current sense circuit responsive to the low dropout regulator for determining the input current to the amplifier; and
    an amplifier control circuit for providing a control voltage to the amplifier, the amplifier control circuit configurable to:
    provide a control voltage for an amplifier including either an enhancement mode or depletion mode device,
    operate using a negative voltage supply generated either by the integrated circuit chip or externally, and/or
    either provide a fixed control voltage or adjust the control voltage in response to a determined input current to keep the input current to the amplifier constant.

24. The active bias control circuit of claim 23 in which the amplifier control circuit is configurable by user accessible pins connected to the integrated circuit chip.

25. The active bias control circuit of claim 24 in which said user accessible pins are further used to adjust the negative voltage supply generated by the integrated circuit chip.

26. A low dropout regulator for providing a regulated voltage and an input current to an amplifier, the regulator comprising:
    a first transistor for providing an input current to the amplifier, and
    an error amplifier responsive to a reference voltage and the first transistor for adjusting the regulated voltage to the amplifier;
    a switch including a switching transistor coupled in series between the first transistor and the input of the amplifier for switching off the input current to the amplifier; and
    a level shifter coupled to the control terminal of the switching transistor for biasing the switching transistor.

27. A method for power up sequencing of an active bias controller for an external amplifier, the method comprising the steps of:
    controlling a control voltage of the amplifier to bring the amplifier control voltage below pinch off;
    if the amplifier control voltage is below pinch off, generating a first enable signal to enable input current to flow to the amplifier;
    generating a second enable signal when a supply voltage is stabilized; and
    in response to the second enable signal, enabling the control voltage to achieve a predetermined amplifier input current.

28. The method of claim 27 further including the step of generating a trigger out signal after the predetermined amplifier input current is achieved.

29. The method of claim 27 in which the first enable signal turns on a switch to enable the input current to flow to the amplifier.

30. The method of claim 27 in which the second enable signal turns on an amplifier control circuit to stabilize the input current.

31. The method of claim 27 in which the control voltage is further adjusted in response to a sensed, scaled down replica of the input current to regulate the input current to the amplifier.

32. The method of claim 27 in which the value of the pinch off voltage is a predetermined voltage.

33. The method of claim 32 further including the step of programming a user accessible pin to set the predetermined voltage.

* * * * *